(12) United States Patent
Dixon et al.

(10) Patent No.: US 11,837,635 B2
(45) Date of Patent: Dec. 5, 2023

(54) METHOD OF FORMING GRAPHENE ON A SILICON SUBSTRATE

(71) Applicant: PARAGRAF LIMITED, Somersham (GB)

(72) Inventors: Sebastian Dixon, Somersham (GB); Ivor Guiney, Somersham (GB); Simon Thomas, Somersham (GB)

(73) Assignee: Paragraf Limited, Somersham (GB)

( * ) Notice: Subject to any disclaimer, the term of this patent is extended or adjusted under 35 U.S.C. 154(b) by 0 days.

(21) Appl. No.: 17/484,699

(22) Filed: Sep. 24, 2021

(65) Prior Publication Data

US 2022/0102501 A1    Mar. 31, 2022

(30) Foreign Application Priority Data

Sep. 25, 2020   (GB) ..................................... 2015217
Sep. 1, 2021    (GB) ..................................... 2112447

(51) Int. Cl.
*H01L 29/16* (2006.01)
*H01L 21/02* (2006.01)

(52) U.S. Cl.
CPC .... *H01L 29/1606* (2013.01); *H01L 21/02008* (2013.01); *H01L 21/02277* (2013.01); *H01L 21/02499* (2013.01); *H01L 21/02527* (2013.01)

(58) Field of Classification Search
None
See application file for complete search history.

(56) References Cited

U.S. PATENT DOCUMENTS

2012/0261640 A1   10/2012  Marinero et al.
2018/0158677 A1   6/2018   Beasley et al.

FOREIGN PATENT DOCUMENTS

CN        105280744 A          1/2016
WO   WO2016/079123 A1 *   5/2016   ......... H01L 31/0747

OTHER PUBLICATIONS

Wang et al, Based on Wafer Level Graphene Controllable Epitaxial Method of MOCVD Device, CN 103590099A, Feb. 19, 2014 (Year: 2014).*
Richardson et al, Tunnel Nitride for Improved Polysilicon Emitter, WO 01/47006, Jun. 28, 2001 (Year: 2001).*
Hey et al., Method of in-situ cleaning of native oxide from silicon surfaces, EP 0637063, Jan. 2, 1995 (Year: 1995).*

* cited by examiner

*Primary Examiner* — Alexander G Ghyka
(74) *Attorney, Agent, or Firm* — Stinson LLP

(57) ABSTRACT

The present invention provides a method for the formation of graphene on a silicon substrate, the method comprising: (i) providing a silicon wafer having a growth surface which is free of native oxides, in a reaction chamber; (ii) nitriding the growth surface with a nitrogen-containing gas with the wafer at a temperature in excess of 800° C., to thereby form a silicon nitride layer; and (iii) forming a graphene monolayer or multiple layer structure on the silicon nitride layer; wherein the method is performed in-situ and sequentially in the reaction chamber. The present invention also provides a graphene-on-silicon layer structure having an intervening silicon nitride layer and free of any intervening native oxide layer.

19 Claims, 5 Drawing Sheets

METHOD OF FORMING GRAPHENE ON A SILICON SUBSTRATE

REFERENCE TO RELATED APPLICATIONS

The present application claims the benefit of United Kingdom Application Nos. 2015217.9, filed Sep. 25, 2020, and 2112447.4 filed Sep. 1, 2021, the entire contents of which are incorporated herein by reference.

FIELD OF THE INVENTION

The present invention relates to a method of forming graphene on silicon with an intervening diffusion barrier. This provides the opportunity to produce graphene-containing devices having reduced current leakage.

BACKGROUND

For many electronic applications, it is necessary to be able to grow dielectric layers into device stacks in order to provide controlled conduction pathways. For instance, in a tunnel transistor, the contacting material must be electrically isolated from the gate in order to stem leakage current. For transistors grown on Si, $SiN_x$ is a useful alternative to $SiO_2$ gate dielectrics, since it can be grown thicker than $SiO_2$ while remaining "dielectrically thin". This is essential as Si-based transistors are continually being scaled down and mass transport across the $SiO_2$ becomes problematic at very small layer thicknesses.

Traditionally, epitaxy of $SiN_x$ is performed using silane and ammonia gases. However the storage, usage and exhaust processing for these gases can be hazardous and costly. Furthermore, it could be argued the use of a binary vapour mixture complicates the growth parameter space in terms of, for example, relative partial pressures, the possibility of homogeneous (vapour-phase) reaction, and the purification of multiple process gases.

Graphene is a well-known material with a plethora of proposed applications driven by the material's theoretical extraordinary properties. Good examples of such properties and applications are detailed in 'The Rise of Graphene' by A. K. Geim and K. S. Novoselev, Nature Materials, Volume 6, 183-191, March 2007 and in the focus issue of Nature Nanotechnology, Volume 9, Issue 10, October 2014.

There is a desire to make electronic devices, such as transistors, with graphene layers. This is because the graphene is highly conductive, yet made from readily abundant reagents. WO 2017/029470, the content of which is incorporated herein by reference, discloses methods for producing two-dimensional materials. Specifically, WO 2017/029470 discloses a method of producing two-dimensional materials such as graphene, comprising heating a substrate held within a reaction chamber to a temperature that is within a decomposition range of a precursor, and that allows graphene formation from carbon released from the decomposed precursor; establishing a steep temperature gradient that extends away from the substrate surface towards an inlet for the precursor; and introducing precursor through the relatively cool inlet and across the temperature gradient towards the substrate surface. The method of WO 2017/029470 may be performed using vapour phase epitaxy (VPE) systems and metal-organic chemical vapour deposition (MOCVD) reactors. Methods disclosed in WO 2017/029470 are preferably used to form a graphene layer structure on a substrate in the method disclosed herein.

WO 2017/029470 includes an example in which a sapphire surface is nitrogen terminated before graphene growth (Example 17). In this example, the sapphire substrate is first prepared by heating within the reaction chamber to a substrate surface temperature of 1100° C. under a hydrogen gas flow of 10000 sccm at a pressure of 50 mbar for at least 5 minutes to remove condensed and contaminating materials or species from the substrate surface. The substrate is then cooled to a temperature of 975° C. whereupon $NH_3$ is introduced at a flow rate of 3000 sccm into the reactor chamber for a period of 60 seconds to nitride, or nitrogen terminate the substrate surface. The flow of $NH_3$ is stopped and the precursor, in this case $CH_4$, is introduced at a flow rate of 200 sccm accompanied by a dilution gas flow of $N_2$ at 7000 sccm for a second period of 60 seconds. The substrate is heated to a temperature of 1220° C., the reactor pressure increased to 700 mbar and the precursor flow increased to a flow rate of 800 sccm accompanied by a dilution gas flow increase to 10000 sccm of $H_2$. After reaching the target substrate temperature of 1220° C. the introduction of precursor, $CH_4$ is pulsed through a cycle of 10 seconds on and 5 seconds off for 15 cycles. In each subsequent cycle the precursor flow rate is reduced by 5 sccm. Upon completion of the 15 cycles the reactor temperature is increased to 1250° C. and held for 60 seconds after which the reactor pressure is reduced to 30 mbar and held for 60 seconds. The reactor pressure is then taken back to 700 mbar for a further 60 seconds, cycling between these two pressures, and holding for 60 seconds, is completed 10 times. The reactor is then cooled, as rapidly as possible, under a continued $H_2$ flow.

The above example is a method for ensuring that the surface of the sapphire is chemically inert before the graphene growth. Nitriding the surface of the $Al_2O_3$ terminates dangling bonds which might be detrimental to forming graphene, i.e. a van der Waals bonded sheet of material. By terminating the substrate surface with nitrogen from the $NH_3$ this problem can be avoided and improved graphene can be formed.

US 2018/158677 A1 relates to growing graphene on substrates and discloses preparation or cleaning of a substrate surface prior to forming a graphene, graphitic carbon, or glassy carbon film.

CN 105280744 A relates to an anti-PID crystalline silicon solar cell which includes a spin-coated graphene dispersion on a high refractive index silicon nitride passivation layer deposited on the front surface of a silicon wafer.

SUMMARY OF THE INVENTION

It is an object of the present invention to provide an improved method suitable for forming graphene-containing electrical devices comprising a passivation layer or a diffusion barrier, in order to reduce current leakage, which method can overcome, or substantially reduce, problems associated with the prior art or at least provide a commercially useful alternative thereto.

Accordingly, in a first aspect there is provided a method for the formation of graphene on a silicon substrate, the method comprising:
  (i) providing a silicon wafer having a growth surface which is free of native oxides, in a reaction chamber;
  (ii) nitriding the growth surface with a nitrogen-containing gas with the wafer at a temperature in excess of 800° C., to thereby form a silicon nitride layer; and
  (iii) forming a graphene mono-layer or multiple layer structure on the silicon nitride layer;

wherein the method is performed in-situ and sequentially in the reaction chamber.

BRIEF DESCRIPTION OF THE DRAWINGS

The present invention will now be described further with reference to the following non-limiting Figures, in which.

DETAILED DESCRIPTION

Figure 1:
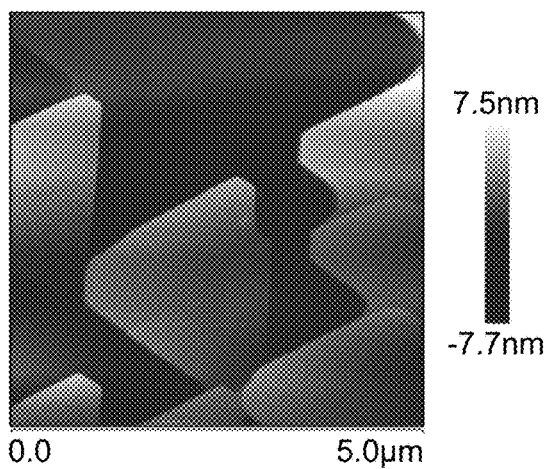
FIG. 1 is an AFM image of a silicon nitride layer on a silicon (111) wafer free of native oxides.

The present disclosure will now be described further. In the following passages, different aspects/embodiments of the disclosure are defined in more detail. Each aspect/embodiment so defined may be combined with any other aspect/embodiment or aspects/embodiments unless clearly indicated to the contrary. In particular, any feature indicated as being preferred or advantageous may be combined with any other feature or features indicated as being preferred or advantageous.

The present inventors have found that when growing graphene layers on silicon (as opposed to sapphire) there are a number of issues which arise. In particular, at high temperature, a graphene film grown onto a silicon substrate can be prone to silicon or silicon contaminants such as B, As, and P diffusing into it, or the carbon atoms diffusing into the silicon. Accordingly, during CVD graphene deposition, such as according to WO 2017/02947, diffusion of C and Si atoms can occur. This is a particular problem for devices where a p/n junction is required (such as solar cells) which can become blurred by the diffusion. Silicon nitride is much more effective than silicon or silicon oxide at blocking the diffusion of atoms.

The present inventors have now found a method which permits the formation of an in-situ nitride layer on silicon using the same apparatus and during the process of growing graphene. The formation of such a layer is distinct from terminating the surface, the latter providing only a single layer of atoms as necessary to terminate any bonds. Rather, the silicon is being reacted with nitrogen (from e.g. $N_2$, $NH_3$ or $NH_2NH_2$) to form a new material, silicon nitride (hereafter also referred to as $SiN_x$). This has dielectric properties, and is a good insulator. $SiN_x$ is well-known in the art and includes the idealised stoichiometric ratio wherein x is 1.33 (i.e. $Si_3N_4$). Silicon rich layers wherein x is as low as 0.5 are still known in the art as silicon nitride.

Accordingly, the present invention permits for the formation of a passivation layer or diffusion barrier between the silicon substrate and the graphene layer formed thereon by a CVD technique such as that disclosed in WO 2017/029470. Advantageously, the method is simple, cost-effective and requires no reactor alteration—it is expected that all MOCVD reactors and CVD reactors are equipped to perform this method without substantial changes.

The ability of an $SiN_x$ dielectric layer to be grown 'natively' directly onto the Si wafer also helps to ensure a high-quality interface between the Si and the dielectric, with substantially lower defect density compared with alternative metal-oxide dielectric materials. By natively it is meant that the silicon in the SiNx comes from the substrate itself. Growth of the dielectric layer in-situ prior to graphene deposition enables direct control over the thickness, defect density and composition of the nitride layer, while also giving a chemically pristine surface for growth of the graphene.

A further advantage is that the $SiN_x$ layer is more resistant to oxidation than silicon, so it acts as a protective barrier to the silicon growth surface against oxygen. More importantly, however, silicon nitride is also less reactive than silicon itself. With respect to graphene growth, a thin layer of silicon nitride prevents a thick layer of silicon carbide from forming when you expose the substrate to the graphene precursor. Accordingly, the formation of the thin layer of $SiN_x$ helps to prevent undesirable side-reactions occurring during the graphene growth and therefore provides an improved graphene layer structure.

The present method relates to the formation of graphene on a silicon substrate. The reference to graphene includes both mono-layers and other graphene layer structures comprising from 2 to 100 layers, preferably from 2 to 50, more preferably from 2 to 20 layers and most preferably from 2 to 10 layers. Preferably, the graphene layer structure comprises a single graphene layer (i.e. a monolayer) so as to provide the unique and advantageous electronic properties associated with monolayer graphene (such as a substantially zero band gap). The inventors have found that a single graphene monolayer is particularly advantageous due to ease of synthesis, but also because it can enables a lower switching voltage (via a greater shift in the Fermi level) in the final transistor (depending on the Si wafer doping). Multilayer graphene offers advantageous properties for the transistor such as improved conduction of both current and heat.

The graphene is formed on a silicon substrate having a silicon growth surface. Silicon wafers are well known in the art. The silicon wafer itself may be a laminate of different layers, provided that the growth layer is formed of silicon. Preferably, the growth surface of the silicon wafer is Si(100) or Si(111), more preferably Si(111). That is, the crystallographic orientation of the silicon wafer is preferably (100) or (111). The inventors have found that such crystallographic orientations of the silicon growth surface are particularly beneficial for the subsequent nitridation and the formation of a highly crystalline silicon nitride layer. Specifically, the inventors have identified that Si(111) is particularly suitable for the method and have found that by nitriding a Si(111) surface, a silicon nitride layer having larger crystal grain sizes can be formed. The average (mean) crystal grain size may be measured using conventional techniques known in the art, for example, by atomic force microscopy (AFM), x-ray diffraction (XRD) or cross-sectional transmission electron microscopy (TEM). For example, a single grain/crystal size may be determined as the diameter of a circle having the same area as the crystal and an average is taken over a representative sample of crystals to obtain an average crystal grain size.

The total thickness of the substrate is typically 50 to 1500 µm, preferably 200 µm to 1200 µm preferably 300 µm to 800 µm. However, thicker substrates also work and thick silicon wafers can be up to 2 mm thick. The minimum thickness of the substrate is however determined in part by the substrate's mechanical properties and the maximum temperature at which the substrate is to be heated. The maximum area of the substrate may be dictated by the size of the reaction chamber when forming a graphene layer structure by MOCVD or VPE. Preferably, the substrate has a diameter of at least 5 cm (2 inches), preferably 15.2 cm (6 inches), preferably 15.2 to 61.0 cm (6 to 24 inches) and more preferably 15.2 to 30.5 cm (6 to 12 inches). The substrate can be cut after growth to form individual devices using any known method. The substrate may instead be cut after formation of the transistor (i.e. formation of the dielectric and contacts). This is particularly preferable wherein a plurality of graphene transistors are manufactured concomitantly on a single common substrate.

The method comprises a first step of providing a silicon wafer having a growth surface which is free of native oxides, in a reaction chamber. Silicon is very reactive and readily forms a silicon oxide. Semiconductor wafers are generally supplied with such native oxides on the surface thereof. Accordingly, in order to be able to provide a nitride layer it is necessary to first remove this layer.

In one embodiment to remove the native oxides the first step comprises: providing a silicon wafer in the reaction chamber; heating the silicon wafer to a temperature in excess of 900° C.; and contacting the growth surface with hydrogen gas to thereby remove native oxides from the growth surface. This method is especially preferred because it can be performed in-situ in the reaction chamber. It is fast, reliable and effective for removing the native oxides.

In this embodiment the hydrogen gas consists of hydrogen. That is, the hydrogen is supplied with only unavoidable impurities. 99.99% purity hydrogen can be readily obtained. The hydrogen can be further purified by passing through a suitable purifier which removes trace organics, water and oxygen from the gas stream. A high purity source of hydrogen is required to ensure that there are no undesirable side reactions.

In an alternative embodiment, the first step comprises: treating a silicon wafer with hydrofluoric acid to thereby remove native oxides from the growth surface and introducing the silicon wafer into the reaction chamber. This method is less preferred because the silicon is reactive and precautions then have to be taken before the wafer is added to the reaction chamber. However, the use of hydrofluoric acid or equivalents serves to quickly remove the oxides without requiring a high temperature processing step.

The method comprises a second step of nitriding the growth surface with a nitrogen-containing gas with the wafer at a temperature in excess of 800° C., preferably in excess of 850° C., to thereby form a silicon nitride layer. Preferably the step of nitriding the growth surface comprises heating the wafer to a temperature of 900-1200° C. more preferably 1055-1190° C. The specific temperature range is dependent on the flow rate of the nitrogen-containing gas, so lower temperatures can be used if higher amounts of the nitrogen-containing gas are used.

Preferably the nitrogen-containing gas consists of nitrogen gas and, optionally, hydrogen gas. Other gases include ammonia and hydrazine. Adding a fraction of $H_2$ gas to the nitrogen-containing gas (preferably $N_2$) flow allows control of the size, shape and distribution of $SiN_x$ nuclei. Preferably the nitrogen-containing gas consists of nitrogen gas and hydrogen gas, and wherein the partial pressure of the hydrogen gas is less than 10% of the total pressure, preferably less than 5%, more preferably less than 2% and even more preferably less than 1%. Advantageously the method can make use of boil-off nitrogen gas, which is abundant and high-purity. It should be noted that the gases may be in the form of a plasma under the nitriding conditions.

The inventors have found that partial pressures of hydrogen of at least 0.1% can be sufficient to provide a significant advantage. For example, the partial pressure of hydrogen may preferably be from 0.1% to 1.0%, such as about 0.1%. Surprisingly, such low levels of hydrogen have been found to strongly influence the morphology of the resulting silicon nitride layer, particularly when nitriding an Si(111) growth surface.

In an alternative embodiment, the nitrogen-containing gas consists of ammonia, optionally together with hydrogen and/or nitrogen.

Preferably a pressure of the nitrogen-containing gas in the reaction chamber is less than 900 mbar, preferably less than 500 mbar, more preferably less than 100 mbar. The use of a higher pressure permits lower growth temperatures.

Preferably the silicon nitride layer has a thickness of from 1 to 500 nm, preferably 1 to 50 nm, more preferably 1 to 20 nm and more preferably 2 to 10 nm. The surface coverage and thickness can be varied by controlling the growth time, temperature and chamber pressure. Thicker layers may be advantageous to avoid high voltage breakdown, although since the silicon for the silicon nitride layer is only coming from the wafer, there are process limitations on the thickness that can be achieved.

Preferably, a surface roughness (which herein refers to root mean square (RMS) surface roughness) of the silicon nitride layer is less than 6.5 nm, preferably less than 5.5 nm. As will be appreciated, the surface roughness relates to the surface upon which the graphene layer structure is subsequently formed. Preferably, the step of nitriding the growth surface is carried out for at least 60 minutes, preferably at least 120 minutes. The inventors have found that Si(111) is particularly suited for such lengths of nitridation and were surprised to find that the surface roughness of the resulting silicon nitride layer was significantly smaller than that grown on Si(100) and continued to decrease with increasing the nitridation time. Consequently, it is particularly preferred that the surface roughness of the silicon nitride layer is less than 3.5 nm, preferably less than 2.5 nm, and even more preferably less than 2.0 nm.

Advantageously, by growing a silicon nitride layer with such a low surface roughness, there was a reduction in the roughness of the resulting graphene grown thereon.

The method comprises a third step of forming a graphene layer structure, either a mono-layer or multiple layer structure, on the silicon nitride layer.

The step of forming a graphene layer structure on the substrate may be achieved by any method known in the art that may performed in-situ and sequentially in the same reaction chamber for silicon nitride growth. It is particularly preferable that the graphene layer structure is formed by VPE or MOCVD. MOCVD is a term used to describe a system used for a particular method for the deposition of layers on a substrate. While the acronym stands for metal-organic chemical vapour deposition, MOCVD is a term in the art and would be understood to relate to the general process and the apparatus used therefor and would not necessarily be considered to be restricted to the use of metal-organic reactants or to the production of metal-organic materials but would simply require the use of a carbon containing precursor. Instead, the use of this term indicates to the person skilled in the art a general set of process and apparatus features. MOCVD is further distinct from CVD techniques by virtue of the system complexity and accuracy. While CVD techniques allow reactions to be performed with straight-forward stoichiometry and structures, MOCVD allows the production of difficult stoichiometries and structures. An MOCVD system is distinct from a CVD system by virtue of at least the gas distribution systems, heating and temperature control systems and chemical control systems. An MOCVD system typically costs at least 10 times as much as a typical CVD system. MOCVD is particularly preferred for achieving high quality graphene layer structures.

MOCVD can also be readily distinguished from atomic layer deposition (ALD) techniques. ALD relies on step-wise reactions of reagents with intervening flushing steps used to remove undesirable by products and/or excess reagents. It does not rely on decomposition or dissociation of the reagent in the gaseous phase. It is particularly unsuitable for the use of reagents with low vapour pressures such as silanes, which would take undue time to remove from the reaction chamber. MOCVD growth of graphene is discussed in WO 2017/029470 which is incorporated by reference and provides the preferred method. The inventors have discovered that such a method is capable of forming graphene across a substrate.

The method of WO 2017/029470 provides two-dimensional materials with a number of advantageous characteristics including: very good crystal quality; large material grain size; minimal material defects; large sheet size; and being self-supporting. The inventors have found that equivalent quality graphene can be formed on such a substrate having distinct regions, the graphene maintaining the advantageous qualities suitable for use in a graphene transistor as described herein.

The method of WO 2017/029470 provides a chamber which has a plurality of cooled inlets arranged so that, in use, the inlets are distributed across the substrate and have a constant separation from the substrate. The flow comprising a precursor compound may be provided as a horizontal laminar flow or may be provided substantially vertically. Inlets suitable for such reactors are well known and include Planetary and Showerhead reactors available from Aixtron®. Other suitable reaction chambers include Turbodisc K-series or Propel MOCVD systems available from Veeco Instruments Inc.

Accordingly, in one particularly preferred embodiment, the step of forming the graphene layer structure comprises:
providing the substrate on a heated susceptor in a reaction chamber, the chamber having a plurality of cooled inlets arranged so that, in use, the inlets are distributed across the substrate and have a constant separation from the substrate,
supplying a flow comprising a precursor compound through the inlets and into the reaction chamber to thereby decompose the precursor compound and form the graphene on the substrate,
wherein the inlets are cooled to less than 100° C., preferably from 50° C. to 60° C., and the susceptor is heated to a temperature of at least 50° C. in excess of a decomposition temperature of the precursor. Preferably the reaction chamber is an MOCVD reaction chamber.

The graphene mono-layer or multiple layer structure may be intentionally doped. Where the graphene layer structure is doped, the graphene is preferably doped with one or more elements selected from the group consisting of silicon, magnesium, zinc, arsenic, oxygen, boron, bromine, phosphorus, aluminium, gallium and nitrogen. Likewise, the method may then preferably comprise introducing a doping element into the reaction chamber and selecting a temperature of the substrate, a pressure of the reaction chamber and a gas flow rate to produce a doped graphene. Preferably, the precursor for doped graphene growth includes the doping element. Alternatively, the precursor comprising the species (which is carbon) and one or more further precursors comprising the doping element are introduced to the substrate within the reaction chamber; the second precursor being a gas or suspended in gas, to produce a doped graphene.

The method is performed in-situ and sequentially in the reaction chamber. That is, at least the steps of nitriding the silicon and then forming the graphene occur within the same reaction chamber without removing the silicon wafer in between. Preferably the method comprises a hydrogen pre-treatment to remove native oxide, nitriding the silicon growth surface and forming the graphene without removing the silicon wafer from the reaction chamber in which the growth takes place.

Accordingly, the present method preferably provides a support suitable for the formation of an electronic device which consists of graphene directly on silicon nitride directly on a silicon substrate. Further device layers and electrical contacts can be formed on the graphene as necessary, depending on the final device desired, such as a light emitting or light sensitive device, such as an OLED, LED or solar panel stack.

According to a further aspect there is provided a graphene-on-silicon layer structure having an intervening silicon nitride layer obtainable by the method described herein. Such a structure can be distinguished over structures where the layers are not formed directly in an in-situ method, such as one where graphene is provided via a transfer growth method. This is because the layers are fully attached and have significantly reduced levels of contaminants and impurities.

In a further aspect, there is provided a graphene-on-silicon layer structure having an intervening silicon nitride layer and free of any intervening native oxide layer, wherein the graphene and intervening silicon nitride layer is provided on Si(100) or Si(111) and/or wherein the silicon nitride layer has an average crystal grain size of at least 500 nm, preferably at least 1 µm.

Preferably, the graphene-on-silicon layer structure of this further aspect is also obtainable by the method described herein. As will be appreciated, the graphene of the graphene-on-silicon layer structure refers to a graphene layer structure, i.e. a monolayer or multi-layer structure as described herein. Thus, the graphene-on-silicon layer structure comprises silicon, a silicon nitride layer directly on the silicon, and a graphene layer structure directly on the silicon nitride layer wherein there is no native oxide layer between the layers. Equally, there are no other intervening layers.

It is particularly preferred that the graphene-on-silicon layer structures described herein are obtainable by the method wherein the reaction chamber is an MOCVD reaction chamber. Such a reaction chamber allows for in-situ desorption of native oxides from a growth surface of a silicon wafer by contacting with hydrogen gas and is equally suited to the subsequent nitridation and graphene growth steps.

By carrying out the in-situ method, and by avoiding any further processing of the silicon nitride (such as to remove native oxides from the surface of a silicon nitride layer), the inventors have found that there is a reduced risk of forming undesired crystallisation phases of the silicon nitride. These undesired phases may otherwise be detrimental to the, preferably MOCVD grown, graphene layer structure by inducing defects which can result in electronic and/or optical scattering.

The most common approach to depositing silicon nitride in the art is by plasma-enhanced chemical vapour deposition (PECVD). Other techniques include low pressure chemical vapour deposition (LPCVD). However, due to a combination of the low growth temperatures (of about 200-450° C.) and the ionic nature of the reactant vapour introduced, the approach results in poorly crystalline films with high built-in compressive or low tensile stresses. The grain size of deposited silicon nitride are typically around 10 nm. The result is a nitride which is very thermally unstable, as grain growth and relaxation processes occur when ramping the silicon nitride on silicon wafer to the significantly hotter temperatures of over 900° C. for graphene growth, particularly for growth by MOCVD. The inventors have found that these lead to surface roughening and defect formation in the nitride layer which propagate through to graphene growth.

The inventors have found that the grain size of the silicon nitride prepared by nitridation may have an average grain size of greater than 1 μm. Accordingly, it is preferred that the silicon nitride of the graphene-on-silicon layer structure has an average (mean) crystal size of at least 500 nm, preferably at least 1 μm. There is no specific upper limit as to the average crystal grain size. Average crystal grain sizes of up to 3 μm or even up to 5 μm can be achieved. In some embodiments, the average crystal grain size will be larger, particularly on Si(111), where growth may be considered as epitaxial growth wherein the orientation, morphology and/or crystallinity of the silicon nitride is guided by the underlying silicon crystal orientation. Single crystal grains may coalesce so as to form a single crystal silicon nitride layer. Preferably, the average crystal grain size in from 500 nm to 5 μm, more preferably from 1 μm to 3 μm. Such silicon nitride layers are more thermally stable than those whose grain size is smaller and allows for the growth of higher quality graphene.

The inventors have also found that Si(100) and Si(111) provide particularly suitable crystallographic orientations for nitridation. Preferably, the graphene and intervening silicon nitride layer is provided on Si(111). That is, crystallographic orientation of the silicon wafer of the graphene-on-silicon layer structure having the silicon nitride layer and graphene thereon is preferably Si(100) or Si(111). As will be appreciated, the intervening silicon nitride layer is directly on the silicon surface and the graphene directly on the surface of the silicon nitride layer. By employing such silicon wafers in the method described herein, higher quality graphene may be grown in-situ on the silicon nitride layer resulting from nitridation of the silicon growth surface. In particular, the inventors were surprised to find that there was a reduced prevalence for the formation of carbides (i.e. SiC) when growing graphene on silicon nitride on Si(111) when compared to silicon nitride on Si(100).

As described herein with respect to the method, preferably a surface roughness of a surface of the intervening silicon nitride layer having graphene thereon is less than 6.5 nm. In other words, the surface of the silicon nitride upon which the graphene is in direct contact preferably has a surface roughness of less than 6.5 nm, preferably less than 5.5 nm.

For example, it is preferred that the graphene and intervening silicon nitride layer is provided on Si(111) and the surface roughness of the surface of the intervening silicon nitride layer having graphene thereon is less than 3.5 nm, preferably less than 2.5 nm and even more preferably less than 2.0 nm. Thus, the graphene layer structure provided thereon also has a reduced surface roughness which allows for exploitation of the graphene's unique electronic and optical properties as a two-dimensional material, such as in electronic devices.

The present invention will now be described further with reference to the following non-limiting Figures, in which:

FIG. 1 is an AFM image of a silicon nitride layer on a silicon (111) wafer free of native oxides.

Figure 2A:
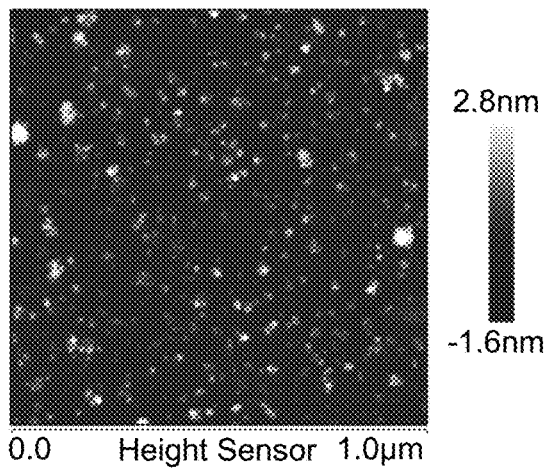
FIG. 2A is an AFM image of a commercially available PECVD grown silicon nitride layer on a silicon wafer.

FIG. 2A is an AFM image of a commercially available PECVD grown silicon nitride layer on a silicon wafer.

Figure 2B:
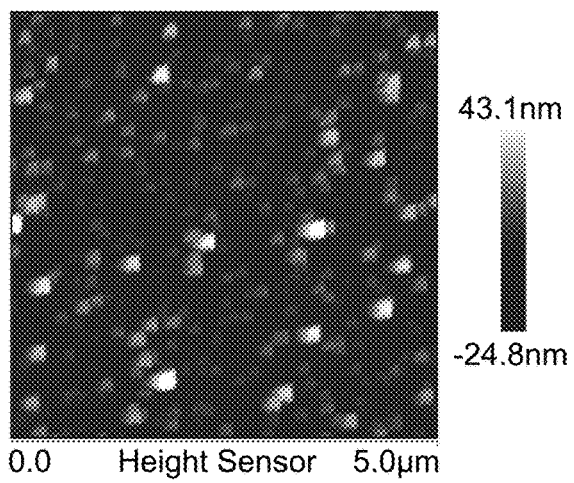
FIG. 2B is an AFM image of MOCVD graphene grown on the commercially available PECVD grown silicon nitride.

FIG. 2B is an AFM image of MOCVD graphene grown on the commercially available PECVD grown silicon nitride.

Figure 3:
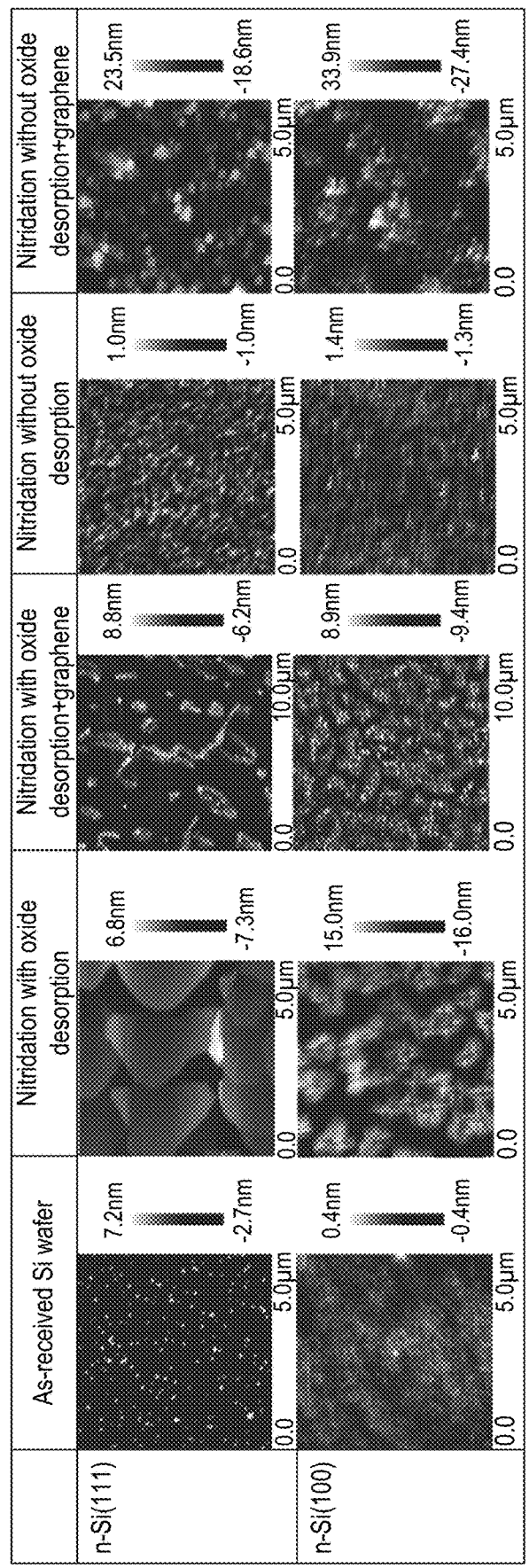
FIG. 3 is table of AFM images for both Si(111) and Si(100) wafers, together with the AFM images of the resulting silicon nitride formed by nitridation with and without native oxide desorption and the resulting graphene formed thereon.

FIG. 3 is table of AFM images for both Si(111) and Si(100) wafers, together with the AFM images of the resulting silicon nitride formed by nitridation with and without native oxide desorption and the resulting graphene formed thereon.

Figure 4:
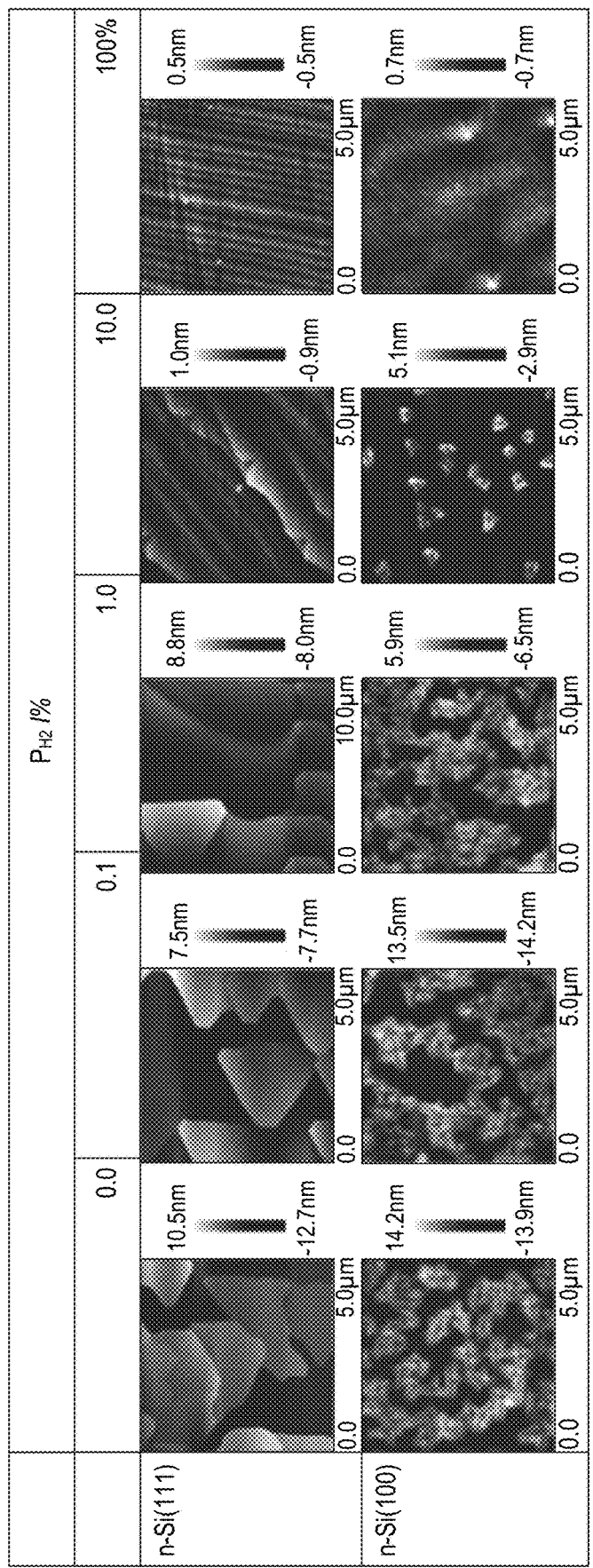
FIG. 4 is a table of AFM images of the resulting silicon nitride layer formed by nitridation of the surface of Si(111) and Si(100) wafers free of native oxide with varying partial pressures of hydrogen in the nitrogen-containing gas.

FIG. 4 is a table of AFM images of the resulting silicon nitride layer formed by nitridation of the surface of Si(111) and Si(100) wafers free of native oxide with varying partial pressures of hydrogen in the nitrogen-containing gas.

Figure 5A:
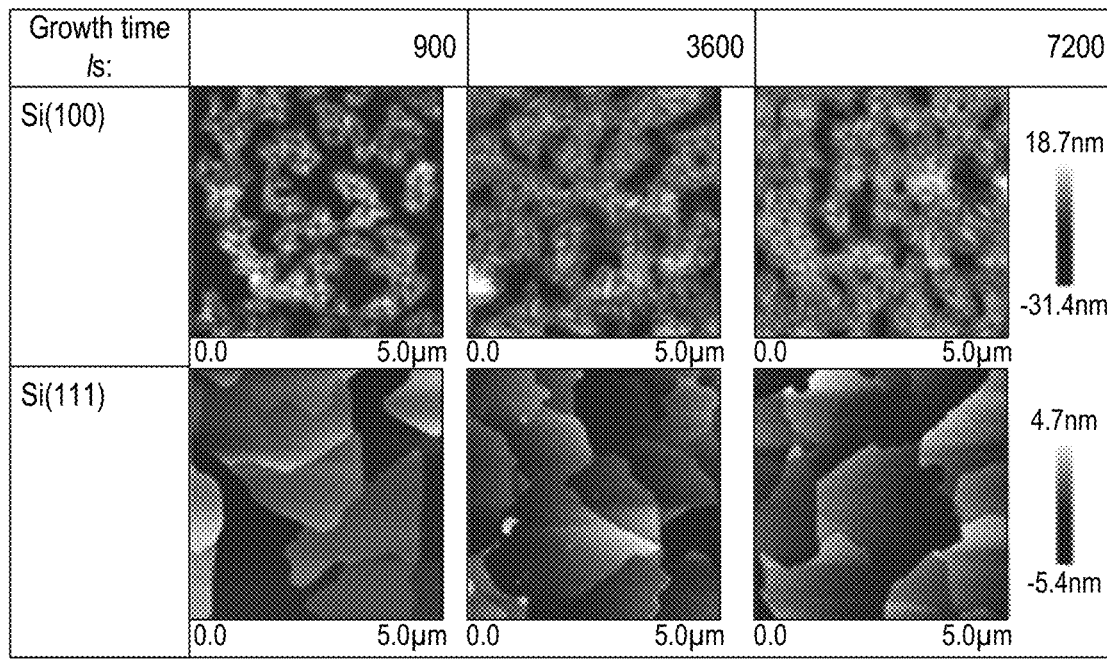
FIG. 5A is a table of AFM images of the resulting silicon nitride layer formed by nitridation of the surface of Si(111) and Si(100) wafers free of native oxide with varying nitridation times.

FIG. 5A is a table of AFM images of the resulting silicon nitride layer formed by nitridation of the surface of Si(111) and Si(100) wafers free of native oxide with varying nitridation times.

Figure 5B:
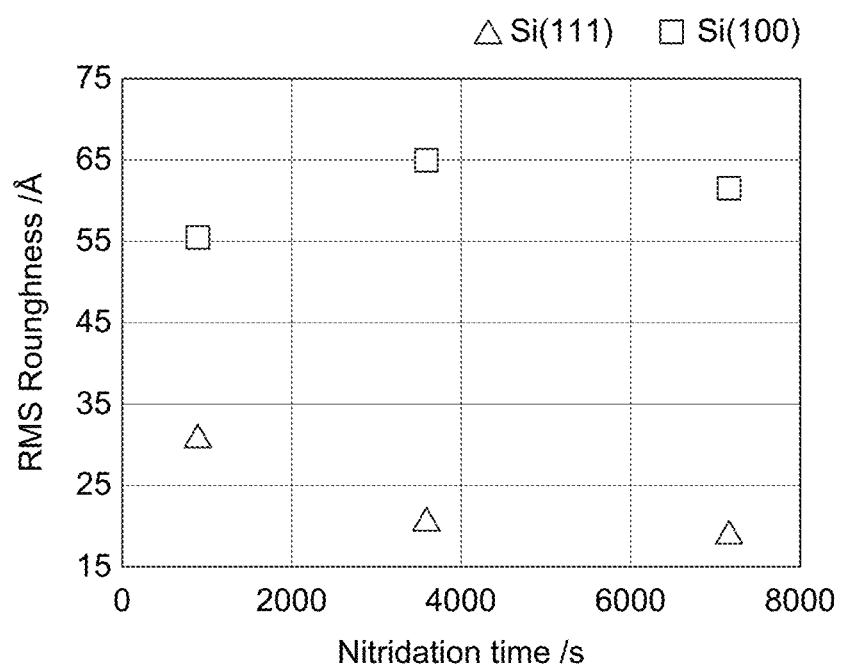
FIG. 5B is a plot of the measured RMS surface roughness of the Examples in FIG. 5A against nitridation time.

FIG. 5B is a plot of the measured RMS surface roughness of the Examples in FIG. 5A against nitridation time.

Figure 6:
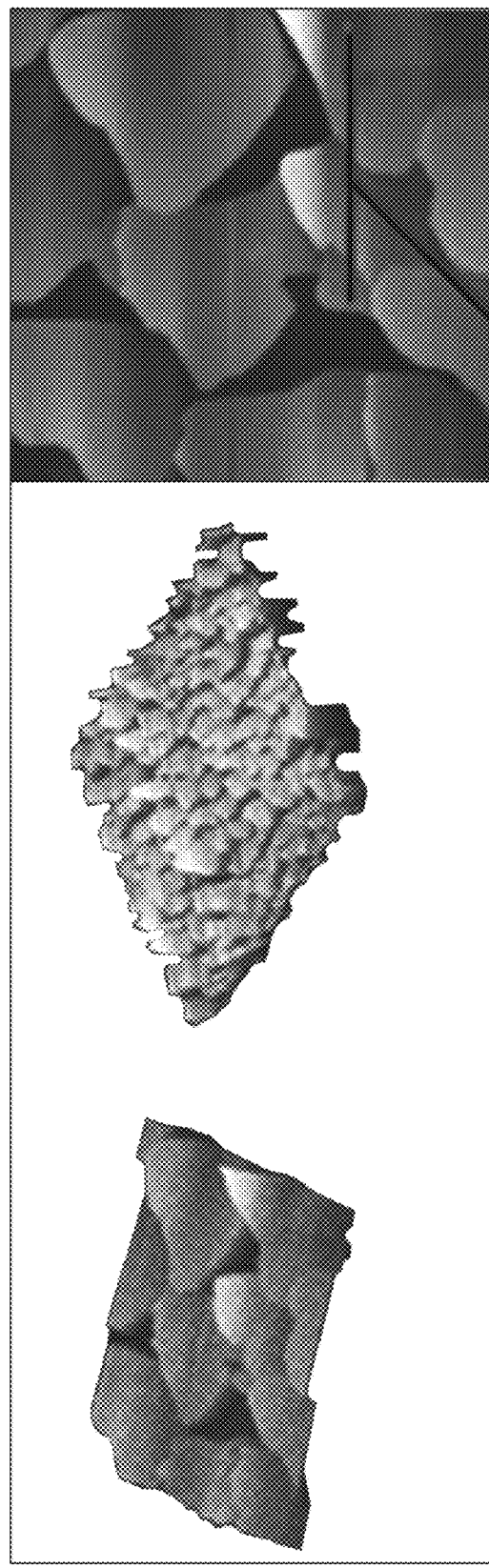
FIG. 6 provides two perspective views at different magnification of a 3D AFM image of the silicon nitride surface obtained by nitridation of a Si(111) wafer together with the equivalent 2D AFM image and a plot of the layer height across a cross section of the silicon nitride layer using a linescan in the AFM
Figure 6:
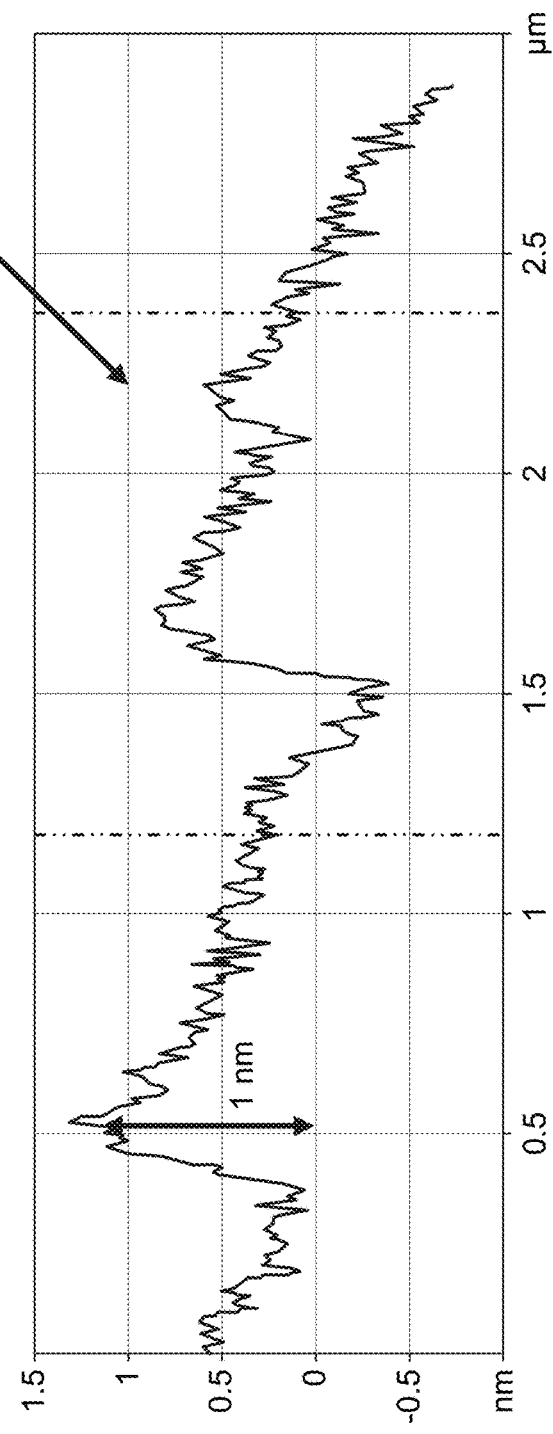

FIG. 6 provides two perspective views at different magnification of a 3D AFM image of the silicon nitride surface obtained by nitridation of a Si(111) wafer together with the equivalent 2D AFM image and a plot of the layer height across a cross section of the silicon nitride layer using a linescan in the AFM FIG. 1 is an AFM image of a silicon nitride layer on a silicon (111) wafer free of native oxides. FIG. 1 illustrates the large crystal grain size of the silicon nitride layer obtainable by nitridation of a silicon wafer free of native oxides.

FIGS. 2A and 2B demonstrate the difficulty observed when growing graphene on PECVD grown silicon nitride. There are large defects observable in the AFM image of the resulting graphene.

FIG. 3 demonstrates that for both Si(111) and Si(100), graphene formed (in an MOCVD reaction chamber) on the silicon nitride layer formed by nitridation of a silicon surface free of native oxides is higher in quality and more uniform that graphene formed under equivalent conditions, with the exception that native oxides are not removed prior to nitridation.

Furthermore, FIG. 3 highlights that silicon nitride with a larger average crystal grain size can be achieved by nitridation of a Si(111) growth surface over a Si(100) growth surface, which in turn leads to the formation of an even higher quality graphene layer structure.

FIG. 4 is a table of AFM images of the resulting silicon nitride layer formed with varying partial pressures of hydrogen in the nitrogen-containing gas. The nitrogen containing gas consists of nitrogen and hydrogen. In a first example, no hydrogen is added to the nitrogen containing gas and in subsequent examples, 0.1%, 1.0% and 10% hydrogen gas are added to along with nitrogen gas. In a final comparison, no nitrogen gas is added and pure hydrogen gas serves to maintain a silicon growth surface free of native oxides.

FIG. 4 demonstrates that the addition of as little as 0.1% hydrogen gives rise to silicon nitride crystals with more defined crystal edges (i.e. a visibly reduced edge roughness), specifically when grown on silicon (111). An improvement is seen up to 1.0% hydrogen and the benefit diminishes above 10% hydrogen.

FIG. 5A is a table of AFM images of the resulting silicon nitride layer formed with varying nitridation times of 900 s, 3600 s and 7200 s on both Si(111) and Si(100) wafers.

FIG. 5B is a plot of the measured RMS surface roughness of the Examples in FIG. 5A against nitridation time. FIG. 5B demonstrates that a reduction in surface roughness is observed as the nitridation time increases for Si(111). In contrast, the same process on Si(100) increased roughness over time to a maximum at 6.5 nm. On Si(111), a surface roughness of less than 3.5 nm is achieved at least at nitridation times of greater than 900 s, a surface roughness of less than 2.5 nm is achieved at least at nitridation times of greater than 3600 s and ultimately, a surface roughness of less than 2.0 nm was achieved at a nitridation time of greater than 7200 s.

FIG. 6 provides two perspective views at different magnification of a 3D AFM image of the silicon nitride surface obtained by nitridation of a Si(111) wafer together with the equivalent 2D AFM image and a plot of the layer height across a cross section of the silicon nitride layer using a linescan in the AFM.

By employing the method of the present invention, which comprises nitridation of a silicon wafer free of native surface oxides, the inventors have found that highly uniform, atomically smooth thin flakes of silicon nitride may be formed enabling the production of an improved silicon nitride layer at very low thicknesses, particularly at the preferred thicknesses of from 1 nm to 10 nm as described herein.

EXAMPLES

The invention will now be described further in relation to the following non-limiting examples.

First the native oxide is stripped from a silicon (100) or (111) wafer in-situ by exposing to 500 mbar undiluted $H_2$ at 1084° C. for 10-15 min. Then the resulting high-energy silicon (100) or (111) surface is exposed to 50 mbar undiluted $N_2$ gas at 1055-1120° C. for 15 min to create an $SiN_x$ layer. Thereafter a graphene layer is deposited thereon using the method disclosed in WO 2017/02947. In further comparative examples, the process was repeated without the removal of native oxides, i.e. without the heating under $H_2$. The results are shown and compared in FIG. 3. In other examples of the nitridation step of the present invention, the nitridation time was 60 min or 120 min and the results shown in FIGS. 5A and 5B.

In another embodiment of the present invention, the above example was modified to create the $SiN_x$ layer by exposure to 50 mbar of $N_2$ gas consisting of nitrogen and hydrogen gas, wherein the partial pressure of hydrogen was 0.1%, 1.0% or 10%. The results are shown in FIG. 4 and by way of comparison, the example was repeated with 100% hydrogen gas.

As used herein, the singular form of "a", "an" and "the" include plural references unless the context clearly dictates otherwise. The use of the term "comprising" intended to be interpreted as including such features but not (necessarily) limited to is also intended to include the option of the features necessarily being limited to those described. In other words, the term also includes the limitations of "consisting essentially of" (intended to mean that specific further components can be present provided they do not materially affect the essential characteristic of the described feature) and "consisting of" (intended to mean that no other feature may be included such that if the components were expressed as percentages by their proportions, these would add up to 100%, whilst accounting for any unavoidable impurities), unless the context clearly dictates otherwise.

It will be understood that, although the terms "first", "second", etc. may be used herein to describe various elements, layers and/or portions, the elements, layers and/or portions should not be limited by these terms. These terms are only used to distinguish one element, layer or portion from another, or a further, element, layer or portion. Spatially relative terms, such as "below", "beneath", "lower", "above", "upper" and the like, may be used herein for ease of description to describe one element or feature's relationship to another element(s) or feature(s). It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented and the spatially relative descriptors used herein interpreted accordingly.

The foregoing detailed description has been provided by way of explanation and illustration, and is not intended to limit the scope of the appended claims. Many variations in the presently preferred embodiments illustrated herein will be apparent to one of ordinary skill in the art, and remain within the scope of the appended claims and their equivalents.

The invention claimed is:

1. A method for the formation of graphene on a silicon substrate, the method comprising:
   (i) providing a silicon wafer having a growth surface which is free of native oxides, in a reaction chamber;
   (ii) nitriding the growth surface with a nitrogen-containing gas with the wafer at a temperature in excess of 800° C., to thereby form a silicon nitride layer; and
   (iii) forming a graphene mono-layer or multiple layer structure on the silicon nitride layer;
   wherein the method is performed in-situ and sequentially in the reaction chamber;
   wherein the growth surface of the silicon wafer is Si(111); and
   wherein a surface roughness of the silicon nitride layer is less than 6.5 nm.

2. The method according to claim 1, wherein step (i) comprises:
   providing a silicon wafer in the reaction chamber;
   heating the silicon wafer to a temperature in excess of 900° C.; and
   contacting the growth surface with hydrogen gas to thereby remove native oxides from the growth surface.

3. The method according to claim 2, wherein the hydrogen gas consists of hydrogen.

4. The method according to claim 1, wherein step (i) comprises:

treating a silicon wafer with hydrofluoric acid to thereby remove native oxides from the growth surface, and introducing the silicon wafer into the reaction chamber.

5. The method according to claim 1, wherein the nitrogen-containing gas consists of nitrogen gas and, optionally, hydrogen gas.

6. The method according to claim 1, wherein a pressure of the nitrogen containing gas in the reaction chamber is less than 900 mbar.

7. The method according to claim 1, wherein the step of nitriding the growth surface comprises heating the wafer to a temperature of 1055-1190° C.

8. The method according to claim 1, wherein the silicon nitride layer has a thickness of from 1 to 500 nm.

9. The method according to claim 1, wherein the thickness of the silicon substrate is from 50 to 1500 μm.

10. The method according to claim 1, wherein the graphene mono-layer or multiple layer structure is intentionally doped.

11. The method according to claim 1, wherein the step of nitriding the growth surface is carried out for at least 60 minutes.

12. The method according to claim 1, wherein a surface roughness of the silicon nitride layer is less than 3.5 nm.

13. The method according to claim 1, wherein the reaction chamber is an MOCVD reaction chamber.

14. A method for the formation of graphene on a silicon substrate, the method comprising:
(i) providing a silicon wafer having a growth surface which is free of native oxides, in a reaction chamber;
(ii) nitriding the growth surface with a nitrogen-containing gas with the wafer at a temperature in excess of 800° C., to thereby form a silicon nitride layer; and
(iii) forming a graphene mono-layer or multiple layer structure on the silicon nitride layer;
wherein the method is performed in-situ and sequentially in the reaction chamber;
wherein the nitrogen containing gas consists of nitrogen gas and hydrogen gas, and wherein the partial pressure of the hydrogen gas is less than 10% of the total pressure; and
wherein a surface roughness of the silicon nitride layer is less than 6.5 nm.

15. The method according to claim 14, wherein step (i) comprises:
providing a silicon wafer in the reaction chamber;
heating the silicon wafer to a temperature in excess of 900° C.; and
contacting the growth surface with hydrogen gas to thereby remove native oxides from the growth surface.

16. The method according to claim 14, wherein step (i) comprises:
treating a silicon wafer with hydrofluoric acid to thereby remove native oxides from the growth surface, and
introducing the silicon wafer into the reaction chamber.

17. The method according to claim 14, wherein the graphene mono-layer or multiple layer structure is intentionally doped.

18. The method according to claim 5, wherein the nitrogen-containing gas consists of nitrogen gas and hydrogen gas, and wherein the partial pressure of the hydrogen gas is less than 10% of the total pressure.

19. The method according to claim 14, wherein the partial pressure of the hydrogen gas is less than 5% of the total pressure.

* * * * *